United States Patent
Lu et al.

(10) Patent No.: US 9,529,272 B2
(45) Date of Patent: Dec. 27, 2016

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 123 days.

(21) Appl. No.: 14/210,652

(22) Filed: Mar. 14, 2014

(65) Prior Publication Data
US 2014/0268092 A1  Sep. 18, 2014

Related U.S. Application Data

(60) Provisional application No. 61/787,102, filed on Mar. 15, 2013.

(51) Int. Cl.
 G03B 27/32 (2006.01)
 G03F 7/20 (2006.01)
 G03F 1/22 (2012.01)

(52) U.S. Cl.
 CPC ............ *G03F 7/70091* (2013.01); *G03F 1/22* (2013.01); *G03F 7/70125* (2013.01); *G03F 7/70283* (2013.01); *G03F 7/70308* (2013.01); *G03F 7/70325* (2013.01)

(58) Field of Classification Search
 CPC .... G03F 1/22; G03F 7/70091; G03F 7/70125; G03F 7/7015; G03F 7/70283; G03F 7/70308; G03F 7/70325
 See application file for complete search history.

(56) References Cited

U.S. PATENT DOCUMENTS

| | | | |
|---|---|---|---|
| 8,628,897 B1 | 1/2014 | Lu et al. | |
| 9,261,774 B2 * | 2/2016 | Lu | G03F 1/24 |
| 2002/0192570 A1 * | 12/2002 | Smith | G03F 1/36 |
| | | | 430/5 |
| 2005/0031969 A1 * | 2/2005 | Finders | G03F 7/70358 |
| | | | 430/5 |
| 2009/0111056 A1 * | 4/2009 | Hendel | G03F 7/2022 |
| | | | 430/296 |
| 2009/0117491 A1 * | 5/2009 | Hendel | G03F 7/203 |
| | | | 430/296 |

(Continued)

*Primary Examiner* — Deoram Persaud
(74) *Attorney, Agent, or Firm* — Haynes and Boone, LLP

(57) ABSTRACT

A process of an extreme ultraviolet lithography (EUVL) is disclosed. The process includes receiving an extreme ultraviolet (EUV) mask with multiple states. These different states of the EUV mask are assigned to adjacent polygons and adjacent assist polygons. The EUV mask is exposed by a nearly on-axis illumination (ONI) with partial coherence σ less than 0.3 to produce diffracted lights and non-diffracted lights. Most of the non-diffracted lights reflected from main polygons and reflected lights from assist polygons are removed. The diffracted lights and the not removed non-diffracted lights reflected from main polygons are collected and directed to expose a target by a projection optics box.

20 Claims, 5 Drawing Sheets

(56) References Cited

U.S. PATENT DOCUMENTS

| | | | |
|---|---|---|---|
| 2009/0220869 A1* | 9/2009 | Takai | B82Y 10/00 430/5 |
| 2009/0263730 A1* | 10/2009 | Kim | B82Y 10/00 430/5 |
| 2011/0229805 A1* | 9/2011 | Wang | G03F 1/36 430/5 |
| 2012/0221981 A1* | 8/2012 | Fujimura | G03F 7/2061 716/53 |
| 2013/0157177 A1* | 6/2013 | Yu | G03F 1/24 430/5 |
| 2014/0011120 A1* | 1/2014 | Lu | G03F 1/24 430/5 |
| 2014/0268087 A1* | 9/2014 | Yu | G03F 1/24 355/71 |
| 2014/0268091 A1* | 9/2014 | Lu | G03F 1/22 355/77 |
| 2015/0040081 A1* | 2/2015 | Huang | G03F 1/36 716/53 |

* cited by examiner

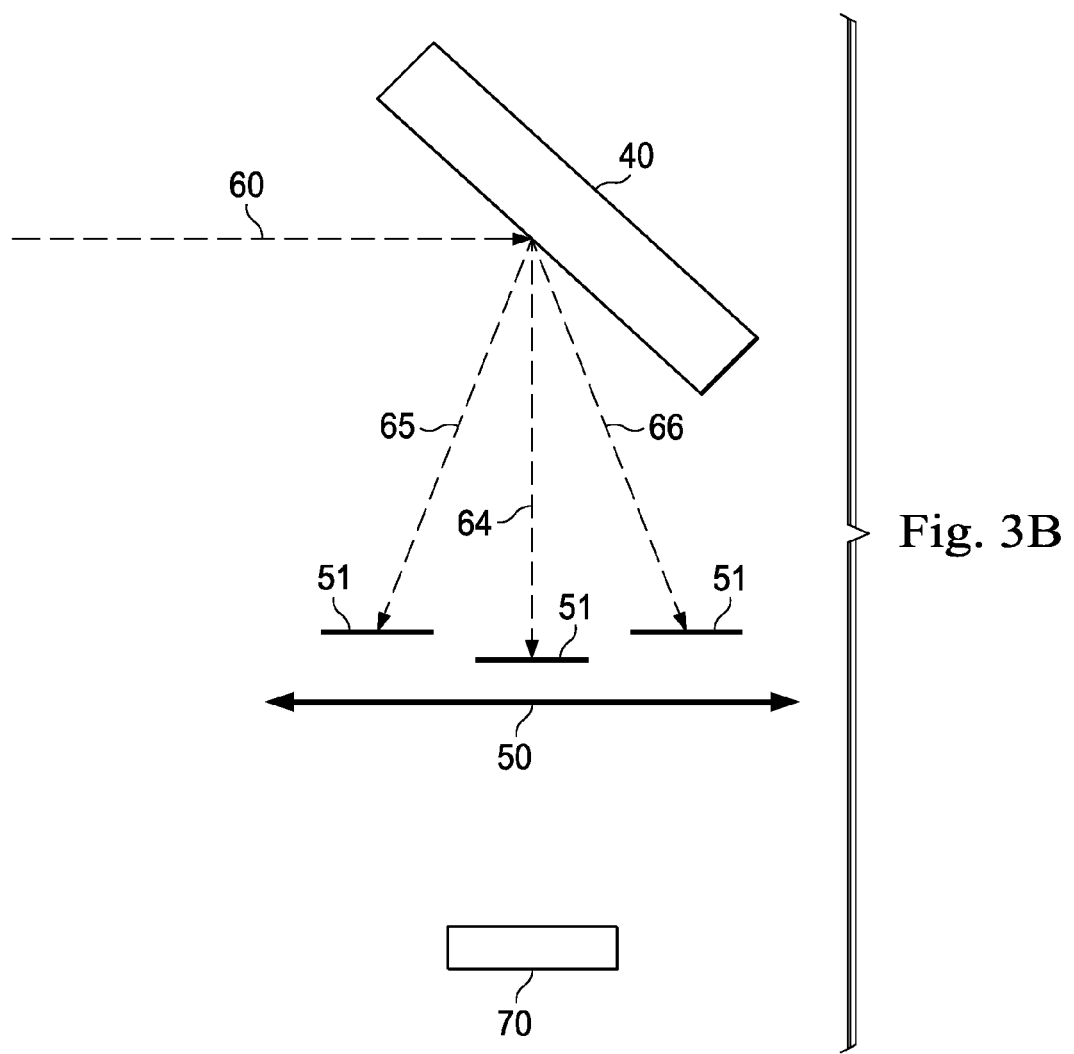

EXTREME ULTRAVIOLET LITHOGRAPHY PROCESS AND MASK

This patent claims the benefit of U.S. Ser. No. 61/787,102 filed Mar. 15, 2013, which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

EUVL is a promising patterning technology for very small semiconductor technology nodes, such as 14-nm, and beyond. EUVL is very similar to optical lithography in that it needs a mask to print wafers, except that it employs light in the EUV region, i.e., at about 13.5 nm. At the wavelength of 13.5 nm, most materials are highly absorbing. Thus, reflective optics, rather than refractive optics, are commonly used in EUVL. Although existing methods of EUVL have been generally adequate for their intended purposes, they have not been entirely satisfactory in all respects. For example, an error printed on a wafer from a mask error may be magnified by a factor, referred to as mask error enhancement factor (MEEF). It is desired to reduce MEEF.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B are diagrammatic perspective views of a projection optics box (POB) employed in the lithography process for implementing one or more embodiments of the present disclosure. Since a POB by reflective optics is difficult to sketch, the equivalent refractive optics is used to illustrate the underlying principle.

DETAILED DESCRIPTION

Figure 1:
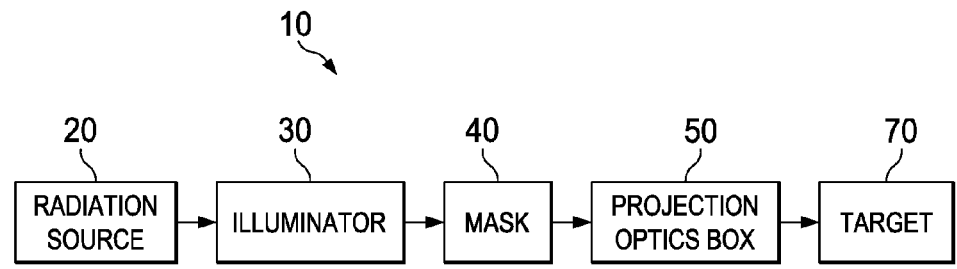
FIG. 1 is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present disclosure is disclosed. The EUV lithography process 10 employs an EUV radiation source 20 having a wavelength of about 1-100 nm, including an EUV wavelength of about 13.5 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors in order to direct light from the radiation source 20 onto a mask 40. In the EUV wavelength range, reflective optics is employed generally. Refractive optics, however, can also be realized by zoneplates. In the present embodiment, the illuminator 30 is set up to provide an on-axis illumination (ONI) to illuminate the mask 40. In ONI, all incoming light rays incident on the mask are at the same angle of incidence (AOI), e.g., AOI=6°, as that of a chief ray. In many situations, there may be some angular spread of the incident light. For example, the EUV lithography process 10 may utilize disk illumination (i.e., illumination on a pupil plane is shaped like a disk centered at the pupil center). When a small partial coherence σ, e.g., σ=0.3, is employed, the maximum angular deviation from the chief ray is $\sin^{-1}[m \times \sigma \times NA]$, where m and NA are the magnification and numerical aperture, respectively, of the imaging system (i.e., the projection optics box (POB) 50 to be detailed below). Partial coherence σ can also be used to describe a point source which produces a plane wave for illuminating the mask 40. In this case, the distance from the pupil center to the point source in the pupil plane is NA×σ and the AOI of the corresponding plane wave incident on the mask 40 is $\sin^{-1}$ [m×σ×NA]. In the present embodiment, it is sufficient to employ a nearly ONI having point sources with σ less than 0.3.

The EUV lithography process 10 also employs a mask 40 (in the present disclosure, the terms mask, photomask, and reticle are used to refer to the same item). The mask 40 can be a transmissive mask or a reflective mask. In the present embodiment, the mask 40 is a reflective mask and has main polygons (for circuit patterns) and assist polygons in a field (a region without main polygons). The mask 40 may incorporate other resolution enhancement techniques such as phase-shifting mask (PSM) and/or optical proximity correction (OPC). The mask 40 will be described in further detail later.

Figure 2A:
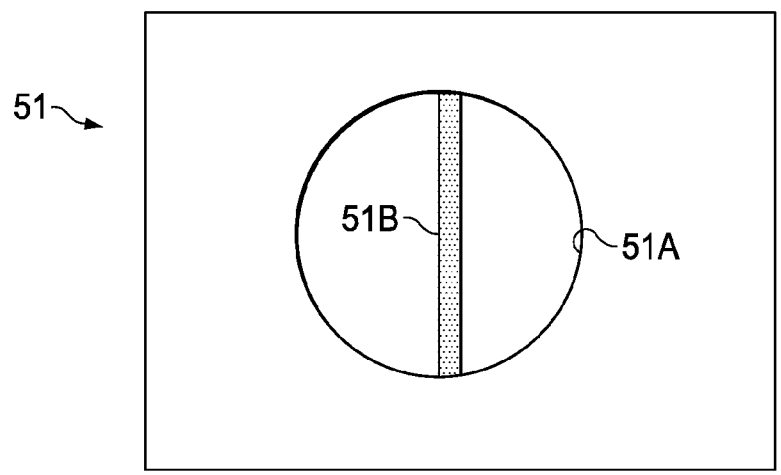
FIGS. 2A-2C are diagrammatic top views of a pupil filter employed in the lithography process for implementing one or more embodiments of the present disclosure.
Figure 2B:
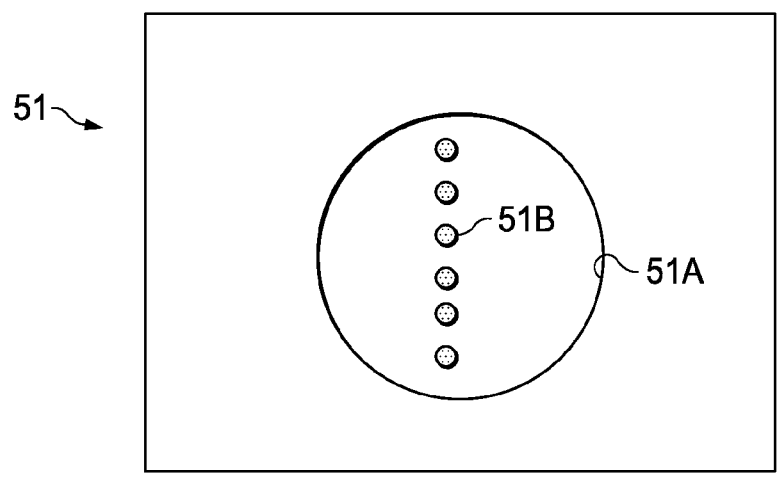
Figure 2C:
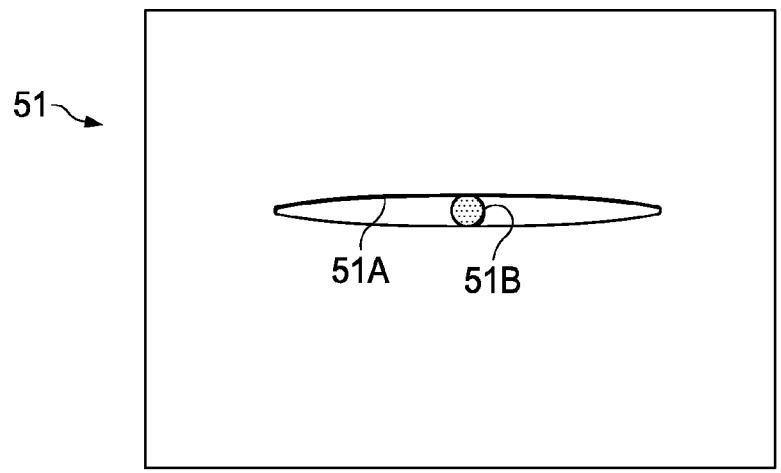

The EUV lithography process 10 also employs a projection optics box (POB) 50. The POB 50 may have refractive optics or reflective optics. The radiation reflected from the mask 40 (e.g., a patterned radiation) is collected by the POB 50. The POB 50 also includes a pupil filter 51 placed at an optics pupil plane to controlling the light intensity distribution reflected from the mask 40. The pupil filter 51 has a plurality of light-transmitting regions 51A to transmit light reflected from the mask 40 to a substrate, such as a wafer, and a plurality of opaque regions 51B to block light reflected from the mask 40 thereby from transmitting through. In the present embodiment, the pupil filter 51 may employ various of patterns, such as shown in FIGS. 2A to 2C, to block targeted lights reflected from the mask 40, which will be described in detail below.

Figure 3A:
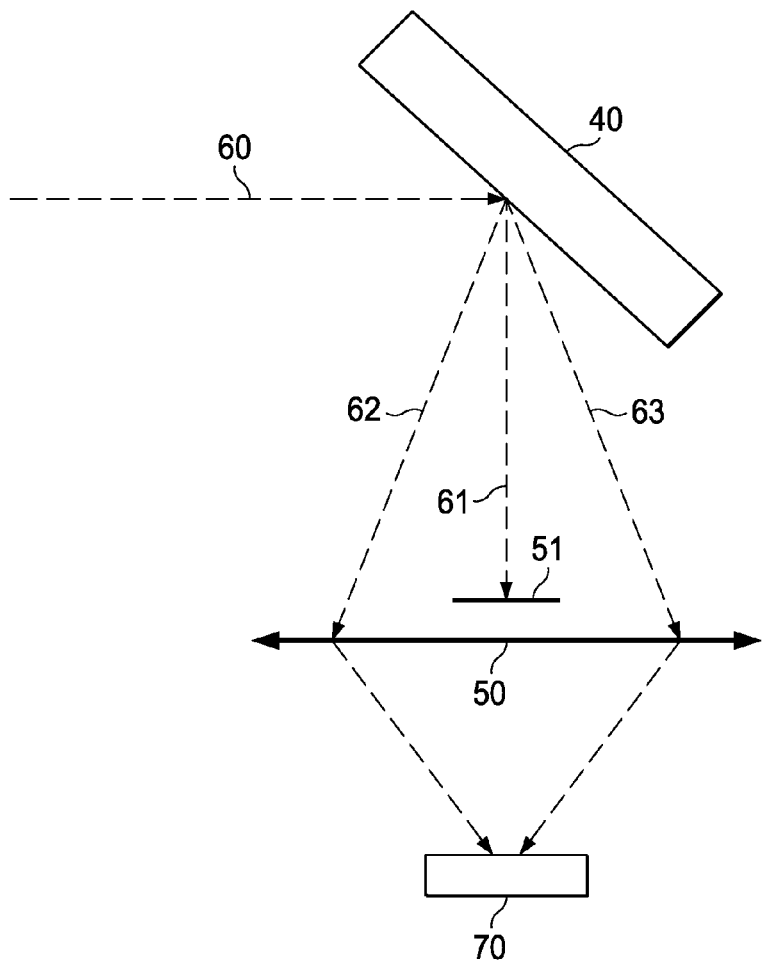

Referring to FIG. 3A, an incident light ray 60, after being reflected from main polygons of the mask 40, is diffracted into various diffraction orders due to the presence of mask patterns, such as a 0-th diffraction order ray 61, a −1-st diffraction order ray 62 and a +1-st diffraction order ray 63. For lithographic imaging, a disk illumination with partial coherence σ being at most 0.3 generated by the illuminator 30 may be employed. In the depicted embodiment, the non-diffracted light rays 61 are mostly (e.g., more than 70%) removed by the pupil filter 51 in the POB 50. The −1-st and +1-st diffraction order rays, 62 and 63, are collected by the POB 50 and directed to expose a target 70. Since the strength of the −1-st and +1-st diffraction order rays, 62 and 63, are well balanced, they interfere with each other and will generate a high contrast aerial image. Also, the −1-st and +1-st diffraction order rays, 62 and 63, are of the same distance from the pupil center in the pupil plane, and depth of focus (DOF) is maximized.

Referring to FIG. 3B, the incident light ray 60, after reflecting from assist polygons of the mask 40, is diffracted into various diffraction orders, such as a 0-th diffraction order ray 64, a −1-st diffraction order ray 65 and a +1-st diffraction order ray 66. In the present embodiment, by choosing an appropriate pitch size of the assist polygon of the mask 40 and collaborating with the pupil filter 51 having an appropriate pattern, non-diffraction and diffraction order rays 64, 65, and 66 are filtered out by the pupil filter 51 so that they do not expose the target 70. By adjusting the pitch size of assist polygons, the MEEF of main patterns can be changed. The optimal assist polygon pitch can be obtained by simulation calculation.

The target 70 includes a semiconductor wafer with a photosensitive layer (e.g., photoresist or resist), which is sensitive to the EUV radiation. The target 70 may be held by a target substrate stage. The target substrate stage provides control of the target substrate position such that the image of the mask is scanned onto the target substrate in a repetitive fashion (though other lithography methods are possible).

The following description refers to the mask 40 and a mask fabrication process. The mask fabrication process includes two steps: a blank mask fabrication process and a mask patterning process. During the blank mask fabrication process, a blank mask is formed by depositing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Figure 4:
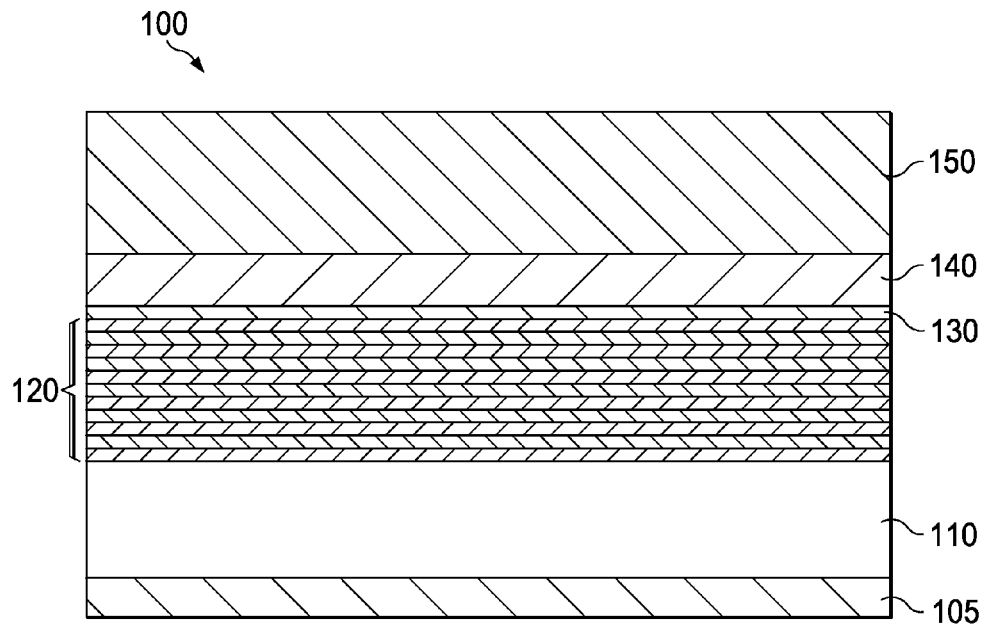
FIG. 4 is a diagrammatic cross-sectional view of various aspects of one embodiment of a blank mask at various stages of a lithography process constructed according to aspects of the present disclosure.

Referring to FIG. 4, a blank EUV mask 100 comprises a substrate 110 made of low thermal expansion material (LTEM). The LTEM material may include $TiO_2$ doped $SiO_2$, and/or other low thermal expansion materials known in the art. The LTEM substrate 110 serves to minimize image distortion due to mask heating. In the present embodiment, the LTEM substrate includes materials with a low defect level and a smooth surface. In addition, a conductive layer 105 may be deposed under (as shown in the figure) the LTEM substrate 110 for the electrostatic chucking purpose. In an embodiment, the conductive layer 105 includes chromium nitride (CrN), though other compositions are possible.

The blank EUV mask 100 includes a reflective multilayer (ML) 120 deposed over the LTEM substrate 110. According to Fresnel equations, light reflection will occur when light propagates across the interface between two materials of different refractive indices. The reflected light is larger when the difference of refractive indices is larger. To increase the reflected light, one may also increase the number of interfaces by deposing a multilayer of alternating materials and let lights reflected from different interfaces interfere constructively by choosing appropriate thickness for each layer inside the multilayer. However, the absorption of the employed materials for the multilayer limits the highest reflectivity that can be achieved. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any material that is highly reflective at EUV wavelengths can be utilized for the ML 120. The thickness of each layer of the ML 120 depends on the EUV wavelength and the incident angle. The thickness of the ML 120 is adjusted to achieve a maximum constructive interference of the EUV light reflected at each interface and a minimum absorption of the EUV light by the ML 120. The ML 120 may be selected such that it provides a high reflectivity to a selected radiation type/wavelength. A typical number of film pairs is 20-80, however any number of film pairs is possible. The ML 120 usually achieves a reflectance of 0.65 or above. In an embodiment, the ML 120 includes forty pairs of layers of Mo/Si. Each Mo/Si film pair has a thickness of about 7 nm, with a total thickness of 280 nm. In this case, a reflectivity of about 70% is achieved.

The blank EUV mask 100 may also include a capping layer 130 disposed above the ML 120 to prevent oxidation of the ML. In one embodiment, the capping layer 130 includes silicon with about 4-7 nm thickness.

The blank EUV mask 100 may also include a buffer layer 140 disposed above the capping layer 130 to act as an etching stop layer in a patterning or repairing process of an absorption layer, which will be described later. The buffer layer 140 has different etching characteristics from the absorption layer. The buffer layer 140 includes ruthenium (Ru), Ru compounds such as RuB, RuSi, chromium (Cr), Cr oxide, and Cr nitride. A low temperature deposition process is often chosen for the buffer layer to prevent inter-diffusion of the ML 120. In the present embodiment, the buffer layer 140 includes chromium with about 2-5 nm thickness. In one embodiment, the capping layer and the buffer layer is a single layer.

An absorption layer 150 is formed above the buffer layer 140. The absorption layer 150 preferably absorbs radiation in the EUV wavelength range projected onto a patterned EUV mask 200. The absorption layer 150 includes multiple film layers from a group of chromium, chromium oxide, titanium nitride, tantalum nitride, tantalum, titanium, or aluminum-copper, palladium, tantalum nitride, aluminum oxide, molybdenum, or other suitable materials. In one embodiment, the absorption layer 150 is configured to achieve an about 180 degree phase change of the reflection light. For example, the absorption layer 150 includes molybdenum having a thickness in a range from 40 nm to 48 nm. With a proper configuration of multiple film layers, the absorption layer 150 will provide process flexibility in a subsequent etching process by different etch characteristics of each film.

One or more of the layers 105, 120, 130, 140 and 150 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a deposition technique by using a liquid-based method in a non-vacuum environment. By using MOD, a metal-organic precursor, dissolved in a solvent, is spin-coated onto a substrate and the solvent is evaporated. A vacuum ultraviolet (VUV) source is used to convert the metal-organic precursors to constituent metal elements.

Figure 5:
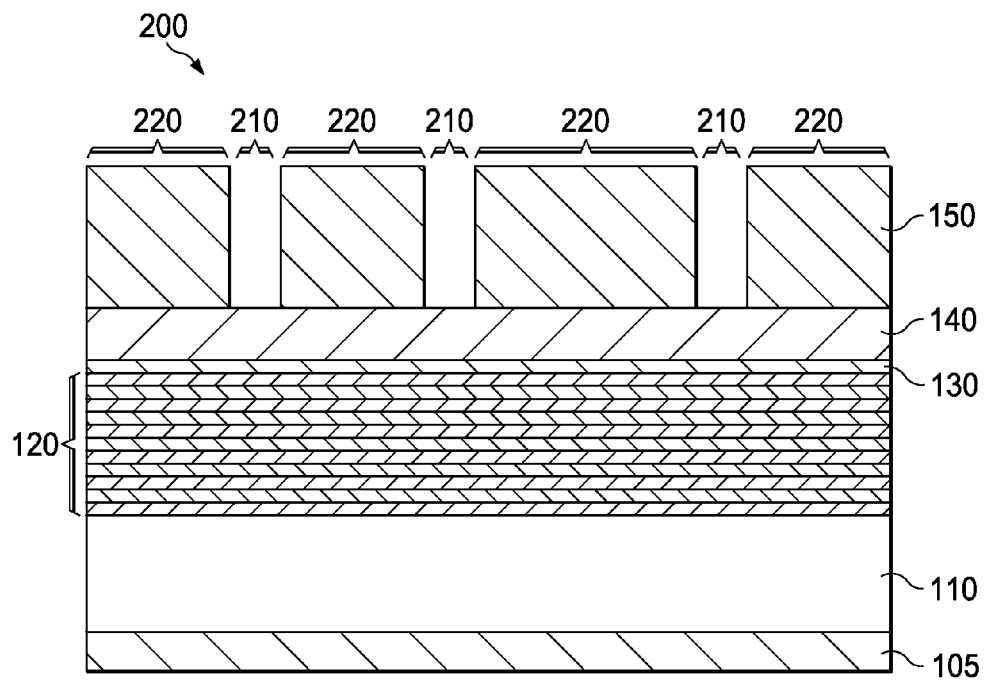
FIG. 5 is a diagrammatic cross-sectional view of various aspects of one embodiment of an EUV mask at various stages of a lithography process constructed according to aspects of the present disclosure.

Referring to FIG. 5, the absorption layer 150 is patterned to form the design layout pattern EUV mask 200 having first and second states, 210 and 220. In the state 210, the absorption layer 510 is removed while in the state of 220, it remains. The absorption layer 150 can be patterned by various patterning techniques. One such technique includes using a resist coating (e.g., spin-on coating), soft baking, mask aligning, exposure, post-exposure baking, developing the resist, rinsing, and drying (e.g., hard baking). An etching process is followed to remove the absorption layer 150 in the first region 210. The etching process may include dry (plasma) etching, wet etching, and/or other etching methods. For example, the dry etching process may implement a fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr and/or CHBR3), iodine-containing gas, other suitable gases and/or plasmas, and/or combinations thereof. Alternative patterning processes include maskless photolithography, electron-beam writing, direct-writing, and/or ion-beam writing.

Figure 6:
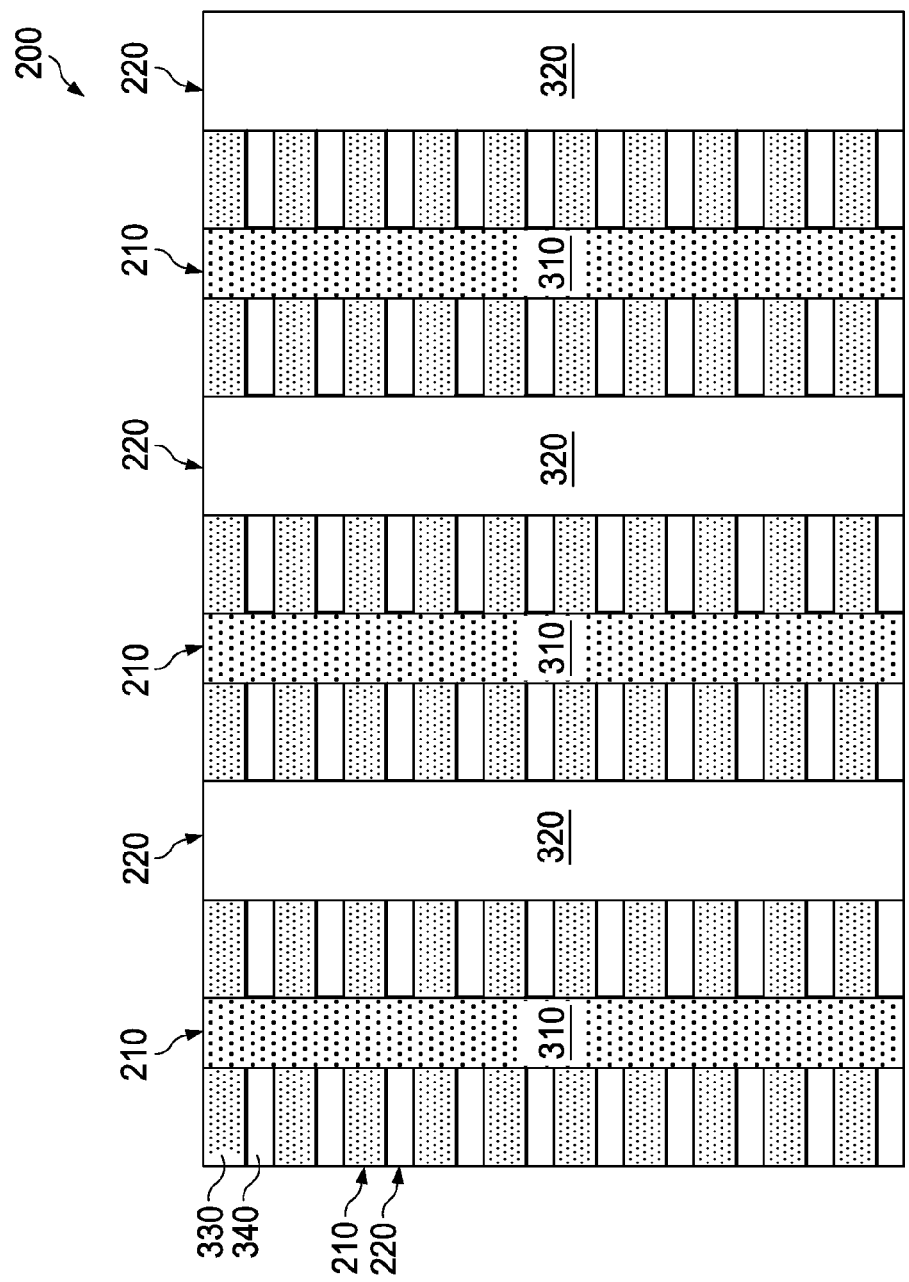
FIG. 6 is a diagrammatic perspective view of an EUV mask according to aspects of the present disclosure.

Referring to FIG. 6, in the present embodiment, states 210 and 220 of the EUV mask 200 are assigned to a first main polygon 310 and a second main polygon 320, which is adjacent to the first main polygon 310. Also states 210 and 220 are assigned to a first assist polygon 330 and a second assist polygon 340, which is adjacent to the first assist polygon 330. By assigning different states of the EUV mask 200 to adjacent polygons and assist polygons, it will reduce the spatial frequency of mask patterns and improve aerial image contrast and process window.

Based on the above, the present disclosure presents an EUV lithography process 10 that employs nearly complete on-axis illumination (ONI), e.g., a disk illumination with partial coherence σ smaller than 0.3, to expose an EUV mask to produce diffracted lights and non-diffracted lights. The EUV lithography process 10 employs a pupil filter to remove more than 70% of the non-diffracted lights reflected from main polygons and filter out reflected lights from assist polygons. The EUV lithography process 10 mainly utilizes the diffracted lights from two symmetrically located (on the pupil plane) and intensity balanced −1-st and +1-st diffraction orders of reflected light from main polygons to expose a semiconductor wafer. The EUV lithography process 10 also employs an EUV mask with two states. Different states are assigned to adjacent polygons and adjacent assist polygons. The EUV lithography process 10 demonstrates an enhancement of aerial image contrast and an improvement of reducing MEEF. The EUV lithography process 10 provides a resolution enhancement technique for future nodes.

The present disclosure is directed towards lithography systems and processes. In one embodiment, an extreme ultraviolet lithography (EUVL) process includes receiving an extreme ultraviolet (EUV) mask with multiple states. These different states of the EUV mask are assigned to adjacent polygons and adjacent assist polygons. The process also includes exposing the EUV mask by a nearly on-axis illumination (ONI) with partial coherence σ less than 0.3 to produce diffracted lights and non-diffracted lights, removing most of the non-diffracted lights reflected from main polygons and removing reflected lights from assist polygons. The process also includes collecting and directing the diffracted lights and the not removed non-diffracted lights from main polygons by a projection optics box (POB) to expose a target.

In another embodiment, an EUVL process receiving an EUV mask with two states and assigning different said states of the EUV mask to adjacent main polygons and adjacent assist polygons in a field (a region without polygons). The process also includes exposing the EUV mask by a nearly on-axis illumination (ONI) with partial coherence σ less than 0.3 to produce diffracted lights and non-diffracted lights, removing more than 70% of the non-diffracted lights reflected from the main polygons by using a pupil filter and removing reflected lights from the assist polygons by using the pupil filter. The process also includes collecting and directing the diffracted lights and the not removed non-diffracted lights reflected from main polygons by a projection optics box (POB) to expose a semiconductor wafer.

The present disclosure is also directed towards masks. In one embodiment, an EUV mask includes a low thermal expansion material (LTEM) substrate, a reflective multilayer (ML) above one surface of the LTEM substrate, a conductive layer above an opposite surface of the LTEM substrate, a capping layer above the reflective ML, a buffer layer above the capping layer, an absorption layer above the buffer layer and a patterning on the absorption layer to form multiple states, wherein different said states are assigned to adjacent main polygons and adjacent assist polygons in a field.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography (EUVL) process, comprising:
   receiving an extreme ultraviolet (EUV) mask with multiple states, wherein different states of the EUV mask are assigned to adjacent polygons and adjacent assist polygons,
       wherein a first assist polygon of the adjacent assist polygons extends continuously from a first polygon of the adjacent polygons to a second polygon of the adjacent polygons,
       wherein a second assist polygon of the adjacent assist polygons extends continuously from the first polygon to the second polygon, and
       wherein the first assist polygon and the second assist polygon are assigned to a same state of the multiple states;
   exposing the EUV mask by an on-axis illumination (ONI) with partial coherence σ less than 0.3 to produce diffracted lights and non-diffracted lights;
   removing a majority of non-diffracted lights reflected from the adjacent polygons;
   removing a majority of diffracted and non-diffracted lights from the adjacent assist polygons; and
   collecting and directing the diffracted lights and the not-removed non-diffracted lights from the adjacent polygons by a projection optics box (POB) to expose a target.

2. The process of claim 1, wherein the EUV mask comprises:
   a low thermal expansion material (LTEM) substrate;
   a reflective multilayer (ML) above one surface of the LTEM substrate;
   a conductive layer above an opposite surface of the LTEM substrate;
   a capping layer above the reflective ML;
   a buffer layer above the capping layer; and
   a patterned absorption layer above the buffer layer.

3. The process of claim 2, wherein the EUV mask includes two states:
   a first state where the absorption layer is removed and a second state where the absorption layer remains.

4. The process of claim 3, wherein the first and the second states are assigned to adjacent polygons.

5. The process of claim 3, wherein the first and the second states are assigned to adjacent assist polygons in a field.

6. The process of claim 1, wherein a pitch size of the adjacent assist polygons is substantially smaller than a pitch size of the adjacent polygons.

7. The process of claim 3, wherein the first and second states have a phase difference of about 180 degree.

8. The process of claim 1, wherein the first assist polygon includes a bottom surface extending continuously from the first polygon to the second polygon.

9. The process of claim 8, wherein the second assist polygon includes a top surface extending continuously from the first polygon to the second polygon.

10. The process of claim 9,
    wherein a third assist polygon of the adjacent assist polygons extends between the first assist polygon and the second assist polygon,
    wherein the third assist polygon extends continuously from the first polygon to the second polygon, and
    wherein the third assist polygon is assigned to an opposite state of the multiple states than the first assist polygon and the second assist polygon.

11. The process of claim 10, wherein the third assist polygon includes a top surface that interfaces with the bottom surface of the first assist polygon, and wherein the third assist polygon includes a bottom surface that interfaces with the top surface of the second assist polygon.

12. An extreme ultraviolet lithography (EUVL) process, comprising:
    receiving an EUV mask with two states;
    assigning different states of the EUV mask to adjacent main polygons and adjacent assist polygons in a field,
        wherein a first assist polygon of the adjacent assist polygons has a side surface that is parallel with a side surface of a first main polygon of the adjacent main polygons,
        wherein the first assist polygon has a top surface that is perpendicular to the side surface of the first main polygon,
        wherein the top surface of the first assist polygon extends continuously from the side surface of the first main polygon to a second main polygon of the adjacent main polygons;
    exposing the EUV mask by a nearly on-axis illumination (ONI) with partial coherence σ less than 0.3 to produce diffracted lights and non-diffracted lights;
    removing more than 70% of the non-diffracted lights reflected from the adjacent main polygons by using a pupil filter;
    removing diffracted and non-diffracted lights from the adjacent assist polygons using the pupil filter; and
    collecting and directing the diffracted lights and the not-removed non-diffracted lights reflected from the adjacent main polygons by a projection optics box (POB) to expose a semiconductor wafer.

13. The process of claim 12, wherein the EUV mask comprises:
    a low thermal expansion material (LTEM) substrate;
    a reflective multilayer (ML) above one surface of the LTEM substrate;
    a conductive layer above an opposite surface of the LTEM substrate;
    a capping layer above the reflective ML;
    a buffer layer above the capping layer; and
    a patterned absorption layer above the buffer layer.

14. The process of claim 13, wherein a first state of the two states is configured as the buffer layer over the capping layer over the reflective ML over the LTEM substrate.

15. The process of claim 13, wherein a second state of the two states is configured as the absorption layer over the buffer layer over the capping layer over the reflective ML over the LTEM substrate.

16. The process of claim 13, wherein a pitch size of the adjacent assist polygons is substantially smaller than a pitch size of the adjacent main polygons.

17. The process of claim 13, wherein collecting the diffracted lights includes collecting lights of −1-st and +1-st diffraction orders.

18. The process of claim 13, wherein directing the diffracted lights includes directing lights of −1-st and +1-st diffraction orders towards the semiconductor wafer.

19. The process of claim 13, wherein the two states have a phase difference of about 180 degree.

20. An extreme ultraviolet lithography (EUVL) mask, comprising:
  a low thermal expansion material (LTEM) substrate;
  a reflective multilayer (ML) above one surface of the LTEM substrate;
  a conductive layer above an opposite surface of the LTEM substrate;
  a capping layer above the reflective ML;
  a buffer layer above the capping layer;
  an absorption layer above the buffer layer; and
  a patterning on the absorption layer to form multiple states, wherein different said states are assigned to adjacent main polygons and adjacent assist polygons in a field,
    wherein a first assist polygon of the adjacent assist polygons extends continuously from a first main polygon of the adjacent main polygons to a second main polygon of the adjacent main polygons.

* * * * *